United States Patent
Chen et al.

(10) Patent No.: US 9,997,355 B1
(45) Date of Patent: Jun. 12, 2018

(54) METHOD FOR PREPARING A QUANTUM DOT MIXTURE WITH A BIMODAL SIZE DISTRIBUTION

(71) Applicant: National Tsing Hua University, Hsinchu (TW)

(72) Inventors: Hsueh-Shih Chen, Hsinchu (TW); Ching-Che Hung, New Taipei (TW)

(73) Assignee: National Tsing Hua University, Hsinchu (TW)

( * ) Notice: Subject to any disclaimer, the term of this patent is extended or adjusted under 35 U.S.C. 154(b) by 0 days. days.

(21) Appl. No.: 15/706,362

(22) Filed: Sep. 15, 2017

(30) Foreign Application Priority Data

Feb. 15, 2017 (TW) .............................. 106104840 A

(51) Int. Cl.
| | | |
|---|---|---|
| B82Y 30/00 | (2011.01) | |
| H01L 21/02 | (2006.01) | |
| C30B 7/14 | (2006.01) | |
| C30B 29/68 | (2006.01) | |
| B22F 1/00 | (2006.01) | |
| B22F 9/24 | (2006.01) | |
| B82Y 40/00 | (2011.01) | |

(52) U.S. Cl.
CPC ...... *H01L 21/02601* (2013.01); *B22F 1/0018* (2013.01); *B22F 9/24* (2013.01); *B82Y 30/00* (2013.01); *B82Y 40/00* (2013.01); *C30B 7/14* (2013.01); *C30B 29/68* (2013.01); *H01L 21/02521* (2013.01); *H01L 21/02628* (2013.01); *C01P 2004/04* (2013.01)

(58) Field of Classification Search
CPC ......... H01L 21/02601; H01L 21/02521; H01L 21/02628; B22F 1/0018; B22F 9/24; B82Y 30/00; B82Y 40/00; C30B 7/14; C30B 29/68
See application file for complete search history.

(56) References Cited

U.S. PATENT DOCUMENTS

2007/0295266 A1  12/2007  Lee et al.
2014/0030193 A1  1/2014  Searson et al.

FOREIGN PATENT DOCUMENTS

| CN | 103911155 A | 7/2014 |
| CN | 106206878 A | 12/2016 |
| TW | 201528544 A | 7/2014 |

*Primary Examiner* — Mohsen Ahmadi
*Assistant Examiner* — Patricia Reddington
(74) *Attorney, Agent, or Firm* — Schwegman Lundberg & Woessner, P.A.

(57) ABSTRACT

A method for preparing a quantum dot mixture with a bimodal size distribution includes steps of: a) preparing a mixed cationic precursor solution, b) preparing a first anionic precursor solution and a second anionic precursor solution, c) conducting a nucleation reaction at a nucleation temperature for a predetermined nucleation time, and d) conducting a crystallite growth reaction at a crystallite growth temperature for a predetermined crystallite growth time.

17 Claims, 12 Drawing Sheets

METHOD FOR PREPARING A QUANTUM DOT MIXTURE WITH A BIMODAL SIZE DISTRIBUTION

CROSS-REFERENCE TO RELATED APPLICATION

This application claims priority of Taiwanese Application No. 106104840, filed on Feb. 15, 2017.

FIELD

The disclosure relates to a method for preparing a quantum dot mixture, and more particularly to a method for preparing a quantum dot mixture with a bimodal size distribution in a one-pot process.

BACKGROUND

Semiconductor nanocrystals (quantum dots) have drawn a great deal of attention in the past decades because of their unique size-dependent property, namely "quantum confinement effect." The quantum dots have been applied in a wide spectrum of fields, such as light-emitting diodes, solar cells, photo-detectors, lasers, and biomarkers due to their outstanding electrical and optical performance governed by the quantum confinement effect.

For example, in the application field of light-emitting diodes, since the optical properties of the quantum dots highly depend on the compositions and sizes thereof, it is an important research direction to control the compositions and the sizes of the quantum dots so as to tune the optical properties of the quantum dots.

U.S. Pat. No. 6,322,901 B1 discloses a coated nanocrystalline material of high luminescence and color selectivity, which includes a substantially monodisperse nanocrystalline core and an over-coating uniformly deposited thereon. The particle size of the nanocrystallite core is in a range of about 25 Å to about 125 Å.

U.S. Pat. No. 6,501,091 B1 discloses an electronic device which comprises a population of quantum dots embedded in a host matrix and a primary light source causing the quantum dots to emit secondary light of a selected color. The quantum dots comprise at least one material selected from the group consisting of CdS, CdSe, CdTe, ZnS, and ZnSe. The host matrix comprises at least one material selected from the group consisting of polymers, silica glasses, and silica gels. The quantum dots may optionally be overcoated to increase photoluminescence.

U.S. Pat. No. 6,821,337 B2 discloses a method of synthesizing a nanocrystallite which comprises combining a metal-containing non-organometallic compound, a coordinating solvent, and a chalcogen source to form a nanocrystallite which can be a member of a population of nanocrystallites having a narrow size distribution.

US 2016/0333267 A1 discloses a quantum dot nanocrystal structure, which includes: a core of a compound M1A1, wherein M1 is a metal selected from Zn, Sn, Pb, Cd, In, Ga, Ge, Mn, Co, Fe, Al, Mg, Ca, Sr, Ba, Ni, Ag, Ti and Cu, and A1 is an element selected from Se, S, Te, P, As, N, I, and O; an inner shell having a composition containing a compound $M1_xM2_{1-x}A1_yA2_{1-y}$, wherein M2 is a metal selected from Zn, Sn, Pb, Cd, In, Ga, Ge, Mn, Co, Fe, Al, Mg, Ca, Sr, Ba, Ni, Ag, Ti and Cu, A2 is an element selected from Se, S, Te, P, As, N, I and O; and a multi-pod-structured outer shell of a compound M1A2 or M2A2 enclosing the inner shell and having a base portion and protrusion portions extending from the base portion.

US 2016/0369975 A1 discloses a quantum dot-containing wavelength converter, which includes a matrix layer and quantum dots dispersed in the matrix layer. Each of the quantum clots includes a core of a compound M1A1, an inner shell, and a multi-pod-structured outer shell of a compound M1A2 or M2A2. Each of M1 and M2 is a metal selected from Zn, Sn, Pb, Cd, In, Ga, Ge, Mn, Co, Fe, Al, Mg, Ca, Sr, Ba, Ni, Ag, Ti and Cu, and each of A1 and A2 is an element selected from Se, S, Te, P, As, N, I, and O. The inner shell contains a compound $M1_xM2_{1-x}A1_yA2_{1-y}$, wherein M2 is different from M1 and A2 is different from A1. The multi-pod-structured outer shell has a base portion and protrusion portions that extend from the base portion in a direction away from the inner shell.

An approach to directly prepare quantum dots with a controllable multimodal size distribution in a simple one-pot synthesis is presented in an article entitled "Direct Synthesis of Quantum Dots with Controllable Multimodal Size Distribution" by Hsueh-Shin Chen et al. in *J. Phys. Chem. C* 2009, 113, 12236-12242. Although the quantum dots having different emission wavelengths may be prepared by the approach, the quantum dots are not formed as a core-shell configuration and the quantum yield thereof is relatively low.

A one-pot synthesis of core/shell quantum dots with bimodal size distribution is described in an article entitled "Wide Gamut White Light Emitting Diodes Using Quantum Dot-Silicone Film Protected by an Atomic Layer Deposited $TiO_2$ Barrier" by Guan-Hong Chen et al. in *Chem. Commun.*, 2015, 51, 14750. Bimodal CdSe cores are first synthesized, followed by growing a ZnS shell. Briefly, Se is mixed with trioctylphosphine (TOP) in toluene to prepare TOPSe. CdSe cores are synthesized by injecting TOPSe into a CdO-containing mixture. After a first quantum dot size group is grown, the growth is suspended by quenching, followed by sequential TOPSe injection to grow a second quantum dot size group. Once the bimodal quantum dot cores are grown, a half of ZnS monomers is injected into the reaction mixture at 180° C. After reacting for 10 minutes, the temperature is increased to 210° C., followed by injecting the rest of the ZnS monomers and further growing.

US 2016/0233378 A1 discloses a quantum dot for emitting light and a method for synthesizing the quantum dot. The quantum dot is synthesized in a one-pot method by controlling the rate and extent of a reaction by controlling the following parameters: (i) type and quantity of reactant, (ii) reaction time, and (iii) reaction temperature. Although the emission wavelength of the quantum dot may be adjusted by controlling the aforesaid parameters, the quantum dots with a bimodal size distribution may not be synthesized simultaneously in the one-pot method.

SUMMARY

Therefore, an object of the disclosure is to provide a one-pot method for preparing a quantum dot mixture with a bimodal size distribution so as to obtain alloyed quantum dots which may emit lights of two different colors and which have a relatively high quantum yield.

According to a first aspect of the disclosure, there is provided a method for preparing a quantum dot mixture with a bimodal size distribution, comprising steps of:

a) preparing a mixed cationic precursor solution containing a precursor of M1 and a precursor of M2, wherein M1 has an atomic number larger than that of M2 and wherein M1 and M2 are independently selected from the group consisting of Zn, Sn, Pb, Cd, In, Ga, Cs, Ge, Ti, Cu, Mn, Co, Fe, Al, Mg, Ca, Sr, Ba, Ni, and Ag;

b) preparing a first anionic precursor solution containing a precursor of A1 and a second anionic precursor solution containing a precursor of A2, wherein A1 has an atomic number larger than that of A2, and wherein A1 and A2 are independently selected from the group consisting of Se, S, Te, P, As, N, and O;

c) subjecting the mixed cationic precursor solution and the first anionic precursor solution to a nucleation reaction at a nucleation temperature for a predetermined nucleation time so as to form in a solution of the nucleation reaction a seed mixture which includes:
a first group of seeds trapped in a first chemical potential well which corresponds to an average size of the first group of seeds, and
a second group of seeds trapped in a second chemical potential well which corresponds to an average size of the second group of seeds, the average size of the second group of seeds being larger than the average size of the first group of seeds; and d) immediately after step c), injecting the second anionic precursor solution into the solution of the nucleation reaction so as to permit the first group of seeds and the second group of seeds to proceed with a crystallite growth reaction at a crystallite growth temperature for a predetermined crystallite growth time so as to form in a solution of the crystallite growth reaction a quantum dot mixture which includes a population of first quantum dots and a population of second quantum dots respectively grown from the first group of seeds and the second group of seeds, the population of the second quantum dots having an average particle size larger than that of the population of the first quantum dots.

According to a second aspect of the disclosure, there is provided a quantum dot mixture with a bimodal size distribution prepared by the aforesaid method.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
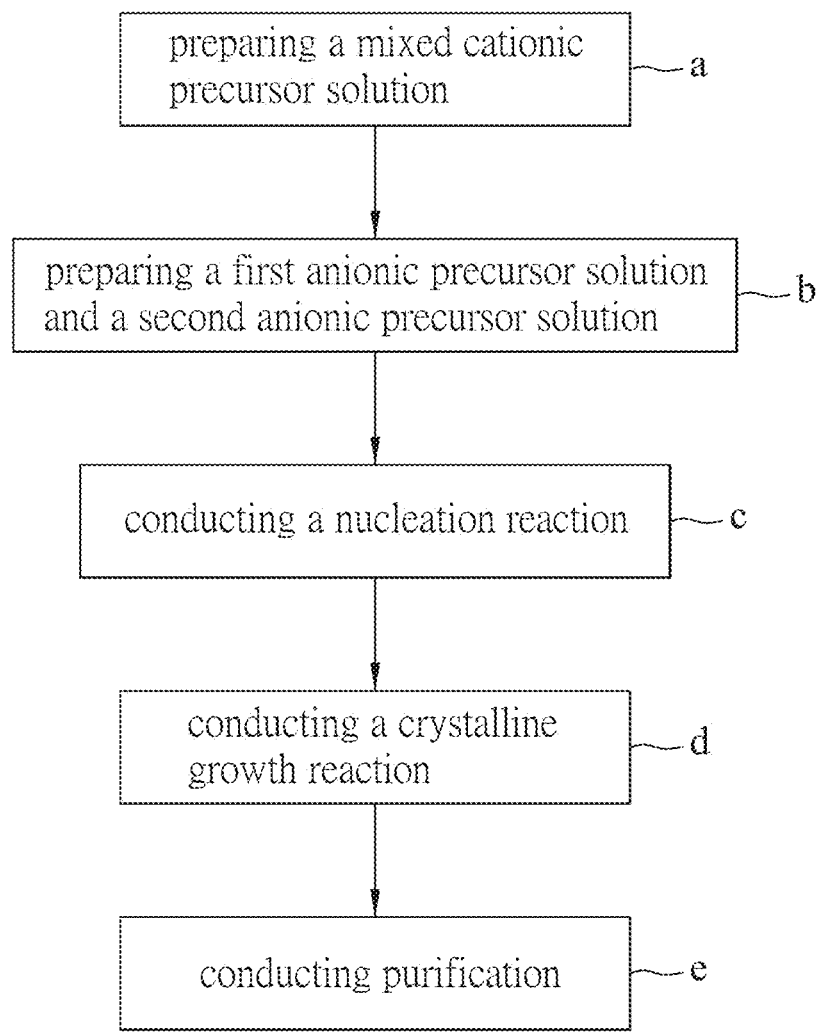
FIG. 1 is a flow chart of an embodiment of a method for preparing a quantum dot mixture with a bimodal size distribution according to the disclosure.

With reference to FIG. 1, a method for preparing a quantum dot mixture with a bimodal size distribution according to the disclosure includes steps of: a) preparing a mixed cationic precursor solution, b) preparing a first anionic precursor solution and a second anionic precursor solution, c) conducting a nucleation reaction, d) conducting a crystallite growth reaction, and e) conducting purification.

In step a), a mixed cationic precursor solution is prepared, which contains a precursor of M1 and a precursor of M2 in a solvent. M1 has an atomic number larger than that of M2, and M1 and M2 are independently selected from the group consisting of Zn, Sn, Pb, Cd, In, Ga, Cs, Ge, Ti, Cu, Mn, Co, Fe, Al, Mg, Ca, Sr, Ba, Ni, and Ag. The solvent is a non-coordinating organic solvent, such as 1-octadecene.

In step b), a first anionic precursor solution containing a precursor of A1 and a second anionic precursor solution containing a precursor of A2 are prepared. A1 has an atomic number larger than that of A2, and A1 and A2 are independently selected from the group consisting of Se, S, Te, P, As, N, and O.

In certain embodiments, the mixed cationic precursor solution and the first and second anionic precursor solutions are prepared in an inert atmosphere, for example, in the presence of nitrogen, helium, argon, or neon.

In step c), the mixed cationic precursor solution and the first anionic precursor solution are subjected to a nucleation reaction at a nucleation temperature for a predetermined nucleation time in the order of seconds so as to form in a solution of the nucleation reaction a seed mixture. Specifically, the mixed cationic precursor solution is heated to a temperature ranging from 300° C. to 310° C., followed by injection of the first anionic precursor solution into the mixed cationic precursor solution to form a reaction mixture solution. The reaction mixture solution then proceeds with the nucleation reaction at the heating temperature (i.e., the nucleation temperature) of 300° C. to 310° C. for the predetermined nucleation time, which is longer than 15 seconds. In certain embodiments, the predetermined nucleation time is in a range from 15 seconds to 180 seconds. In certain embodiments, the predetermined nucleation time is in a range from 30 seconds to 180 seconds.

The seed mixture includes a first group of seeds (referred to as B-aSeeds) and a second group of seeds (referred to as A-aSeeds). The first group of seeds (B-aSeeds) is trapped in a first chemical potential well which corresponds to an average size of the first group of seeds. The second group of seeds (A-aSeeds) is trapped in a second chemical potential well which corresponds to an average size of the second group of seeds. The average size of the second group of seeds is larger than the average size of the first group of seeds.

In step d), the second anionic precursor solution is injected into the solution of the nucleation reaction immediately after step c) so as to permit the first group of seeds (B-aSeeds) and the second group of seeds (A-aSeeds) to proceed with a crystallite growth reaction at a crystallite growth temperature for a predetermined crystallite growth time so as to form in a solution of the crystallite growth reaction a quantum dot mixture which includes a population or first quantum dots (referred to as B-aQDs) and a population of second quantum dots (referred to as A-aQDs) respectively grown from the first group of seeds (B-aSeeds) and the second group of seeds (A-aSeeds). The population of the second quantum dots (A-aQDs) has an average particle size larger than that of the population of the first quantum dots (B-aQDs). The crystallite growth temperature is substantially the same as the nucleation temperature in step c).

In should be noted that when the crystallite growth temperature is too low or the concentration of the second anionic precursor solution is insufficient, the first chemical potential well of the first group of seeds (B-aSeeds) and the second chemical potential well of the second group of seeds (A-aSeeds) may not be overpassed such that the population of the first quantum dots (B-aQDs) and the population of the second quantum dots (A-aQDs) may not be formed. Therefore, in certain embodiments, the precursor of A2 in the second anionic precursor solution is in a concentration larger than 0.06 M. In certain embodiments, the crystallite growth reaction proceeds at the crystallite growth temperature in a range from 300° C. to 310° C. for the predetermined crystallite growth time which is in a range from 60 seconds to 300 seconds. In certain embodiments, the predetermined crystallite growth time is in a range from 120 seconds to 180 seconds.

In step e), the solution of the crystallite growth reaction is cooled to room temperature. Acetone is then added to form precipitates in the solution of the crystallite growth reaction, followed by centrifugation at 5000 rpm for 20 minutes and collection of the precipitates. The precipitates are suspended in toluene, followed by precipitation with excess ethanol and centrifugation at 5000 rpm for 20 minutes. The precipitation and the centrifugation may be repeated two or three times. It should be noted that the purification step may be omitted in certain embodiments.

The quantum dot mixture prepared by the aforesaid method includes the population of the first quantum dots (B-aQDs) and the population of the second quantum dots (A-aQDs) having an average particle size larger than that of the population of the first quantum dots (B-aQDs) such that the population of the first quantum dots (B-aQDs) has an emission wavelength smaller than that of the population of the second quantum dots (A-aQDs). The population of the first quantum dots (B-aQDs) and the population of the second quantum dots (A-QDs) thus prepared have a quantum yield of at least 15%. In certain embodiments, the population of the first quantum dots (B-aQDs) and the population of the second quantum dots (A-aQDs) respectively have a quantum yield of at least 20%.

The average particle sizes and the particle size distributions of the population of the first quantum dots (B-aQDs) and the population of the second quantum dots (A-aQDs) may be controlled so as to tune the emission wavelengths and the photoluminescence intensities of the population of the first quantum dots (B-aQDs) and the population of the second quantum dots (A-aQDs). Therefore, the quantum dot mixture with a bimodal size distribution prepared by the method of the disclosure may be applied widely. Specifically, a quantum dot mixture including the population of the first quantum dots (B-aQDs) and the population of the second quantum dots (A-aQDs) respectively emitting green light and red light may be prepared by the method of the disclosure and used in combination with a blue-light InGaN chip to make a white light emitting diode. The optical properties, such as color rendering index and chromaticity coordinate of the white light emitting diode, can be tuned by controlling the emission wavelengths and the photoluminescence intensities of the population of the first quantum dots (B-aQDs) and the population of the second quantum dots (A-aQDs).

Each of the first and second quantum dots (B-aQDs and A-aQDs) in the quantum dot mixture prepared by the method of the disclosure is formed as a core-and-shell configuration which includes:

a core rich in M1 and A1 and having a composition of $M1_xM2_{1-x}A1$, wherein $0<x<1$; and a shell including:

an inner shell portion enclosing the core and having a composition of $M1_{x'}M2_{1-x'}A1_yA2_{1-y}$, wherein $0<x'<1$, $0<y<1$, and y is gradually decreased along a radial direction away from the core, and an outer shell portion enclosing the inner shell portion and having a composition of M2A2.

In certain embodiments, the first anionic precursor solution further contains a precursor of iodine, and each of the first and second quantum dots (B-aQDs and A-aQDs) in the quantum dot mixture thus prepared is doped with iodine.

Examples of the disclosure will be described hereinafter. It is to be understood that these examples are exemplary and explanatory and should not be construed as a limitation to the disclosure.

EXAMPLE 1

Cadmium oxide (CdO, 0.27 g, 0.21 mmol), zinc acetate ($Zn(OAc)_2$, 7.39 g, 4 mmol), oleic acid (OA, 24.68 g, 12.6 mmol), and 1-octadecene (ODE, 15 ml) were placed in a 100 ml 3-necked round flask and heated to 150° C. under 100 mTorr pressure for a 30 minute degassing procedure. The flask was then filled with nitrogen gas and was further heated to 305° C. to form a mixed cationic precursor solution containing $Cd(OA)_2$ and $Zn(OA)_2$.

Selenium powders (0.09 g, 0.117 mmol) were dissolved in trioctylphosphine (TOP, 0.3 ml) to form a first anionic precursor solution (TOPSe).

Sulfur powders (1.17 g, 3.65 mmol) were dissolved in trioctylphosphine (TOP, 1.7 ml) to form a second anionic precursor solution (TOPS).

The first anionic precursor solution (TOPSe) was injected into the mixed cationic precursor solution at 305° C. After the injection, a nucleation reaction took place at 300° C. for 30 seconds to form in a solution of the nucleation reaction a seed mixture. Immediately thereafter, the second anionic precursor solution (TOPS) was injected into the solution of the nucleation reaction in the flask to allow a crystallite growth reaction to proceed at 300° C. for 180 seconds to form in a solution of the crystallite growth reaction a quantum dot mixture.

The solution of the crystallite growth reaction was cooled to room temperature. Acetone was then added to form precipitates in the solution of the crystallite growth reaction, followed by centrifugation at 5000 rpm for 20 minutes and collection of the precipitates. The precipitates were suspended in toluene (50 ml), followed by precipitation with ethanol (50 ml) and centrifugation at 5000 rpm for 20 minutes. The precipitation and the centrifugation were repeated three times to obtain a quantum dot mixture in a form of powder which includes a population of first quantum dots (B-aQDs) and a population of second quantum dots (A-aQDs).

EXAMPLE 2

The procedure of Example 1 was repeated except that the sulfur powders were used in an amount of 1.82 mmol.

EXAMPLES 3-5

The procedure of Example 1 was repeated except that the nucleation reaction in Examples 3-5 proceeded for 45 seconds, 60 seconds, and 90 seconds, respectively.

EXAMPLES 6-8

The procedure of Example 1 was repeated except that the selenium powders were used in an amount of 0.233 mmol, and that the nucleation reaction in Examples 6-8 proceeded for 30 seconds, 45 seconds, and 60 seconds, respectively.

EXAMPLES 9-11

The procedure of Example 1 was repeated except that the selenium powders were used in an amount of 0.35 mmol, and that the nucleation reaction in Examples 6-8 proceeded for 30 seconds, 45 seconds, and 60 seconds, respectively.

COMPARATIVE EXAMPLE 1

The procedure of Example 1 was repeated except that the second anionic precursor solution (TOPS) was not injected, and that the reaction proceeded for 180 seconds and was immediately followed by purification.

COMPARATIVE EXAMPLE 2

The procedure of Example 1 was repeated except that the sulfur powders were used in an amount of 0.91 mmol (i.e., the S precursor in the second anionic precursor solution was in a concentration of 0.06 M).

COMPARATIVE EXAMPLES 3-5

The procedure of Example 1 was repeated except that the selenium powders used in Comparative Examples 3-5 were in amounts of 0.117 mmol, 0.233 mmol, and 0.35 mmol, respectively, and that the nucleation reaction in Comparative Examples 3-5 proceeded for 15 seconds.

The amounts of CdO, Zn (OAc)$_2$ , Se powders, and S powders, the nucleation time, and the crystalline growth time in Examples 1-11 and Comparative Examples 1-5 are summarized in Table 1 below.

TABLE 1

| | CdO/Zn(OAc)$_2$ (mmol) | Se (mmol) | Nucleation time (seconds) | S (mmol) | Crystalline growth time (seconds) |
|---|---|---|---|---|---|
| Ex. 1 | 0.21/4 | 0.117 | 30 | 3.65 | 180 |
| Ex. 2 | 0.21/4 | 0.117 | 30 | 1.82 | 180 |
| Ex. 3 | 0.21/4 | 0.117 | 45 | 3.65 | 180 |
| Ex. 4 | 0.21/4 | 0.117 | 60 | 3.65 | 180 |
| Ex. 5 | 0.21/4 | 0.117 | 90 | 3.65 | 180 |
| Ex. 6 | 0.21/4 | 0.233 | 30 | 3.65 | 180 |
| Ex. 7 | 0.21/4 | 0.233 | 45 | 3.65 | 180 |
| Ex. 8 | 0.21/4 | 0.233 | 60 | 3.65 | 180 |
| Ex. 9 | 0.21/4 | 0.35 | 30 | 3.65 | 180 |
| Ex. 10 | 0.21/4 | 0.35 | 45 | 3.65 | 180 |
| Ex. 11 | 0.21/4 | 0.35 | 60 | 3.65 | 180 |
| Comp. Ex. 1 | 0.21/4 | 0.117 | 180 | — | — |
| Comp. Ex. 2 | 0.21/4 | 0.117 | 180 | 0.91 | 180 |
| Comp. Ex. 3 | 0.21/4 | 0.117 | 15 | 3.65 | 180 |
| Comp. Ex. 4 | 0.21/4 | 0.233 | 15 | 3.65 | 180 |
| Comp. Ex. 5 | 0.21/4 | 0.35 | 15 | 3.65 | 180 |

APPLICATION EXAMPLES

Figure 12:
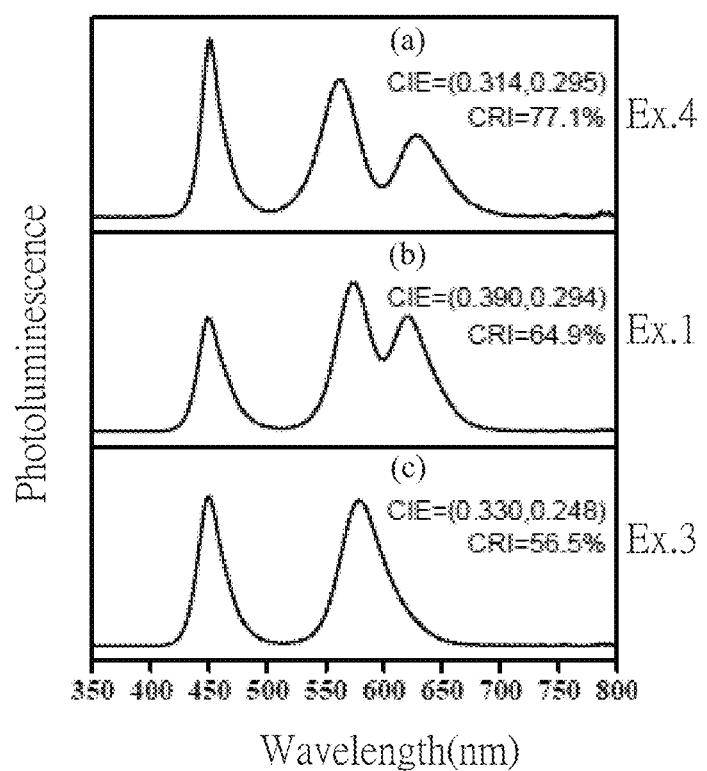
FIG. 12 is a diagram illustrating emission spectra, color rendering indices, and chromaticity coordinates of white light emitting diodes, each of which includes the quantum dot powders and a blue-light InGaN chip.

The quantum dot mixture prepared in each of Comparative Example 3, Example 1, and Example 4 was mixed with polydimethylsiloxane to form a mixture. The mixture was used to form a uniform freestanding film. The freestanding film was then attached to a blue light InGaN chip (λem=450 nm) to form a light emitting diode. The luminescence spectrum, color rendering index (CRI), and Commission Internationale de l'Eclairage (CIE-1931) chromaticity coordinate of the light emitting device were measured. The results are shown in FIG. 12.

Figure 2:
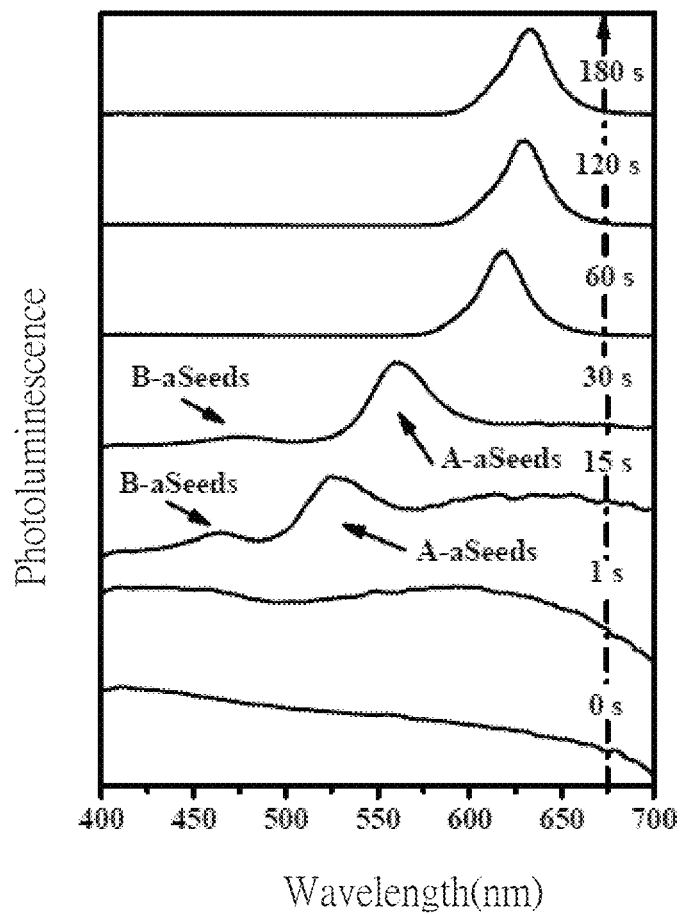
FIG. 2 illustrates photoluminescence spectra of quantum dot powders of Comparative Example 1, which were taken at different sampling times.

Reference is made to FIG. 2. As there is no prominent peak before the injection of TOPSe (i.e., at the nucleation time of 0 second), it is quite obvious that no seed appeared before the injection of TOPSe. After the injection of TOPSe, a very broad PL peak appears, indicating that the nucleation reaction occurred. Two prominent peaks (A-aSeeds and B-aSeeds) appear at the nucleation times of 15 seconds and 30 seconds. The variation from the photoluminescence spectrum at 15 seconds to the photoluminescence spectrum at 30 seconds indicates that the A-aSeeds kept growing into larger seeds, while the B-aSeeds stayed at an original state. After 60 seconds, the peak for the A-aSeeds shifts to a larger emission wavelength, while the peak for the B-aSeeds is too weak to be observed in the photoluminescence spectrum compared to the peak for the A-aSeeds. Finally, the peak for the A-aSeeds stops growing and remains at the wavelength of around 630 nm.

Figure 3:
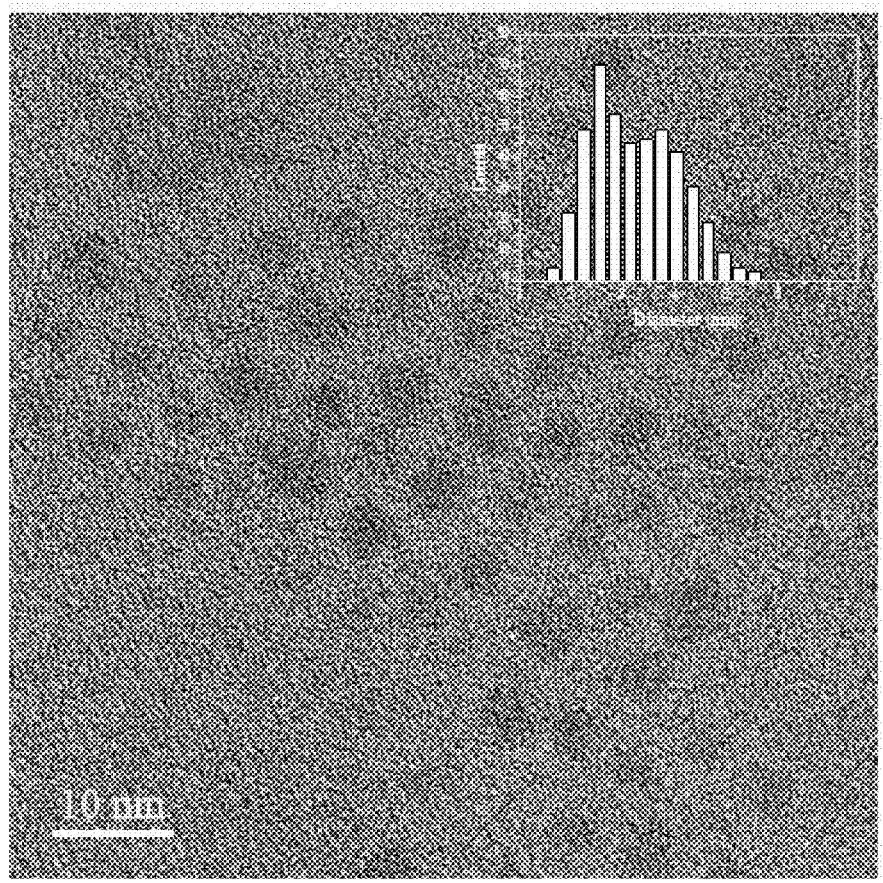
FIG. 3 illustrates a transmission electron microscopy (TEM) image and a size distribution of the quantum dot powders of Comparative Example 1 taken at the 15th second of a crystalline growth reaction.
Figure 4:
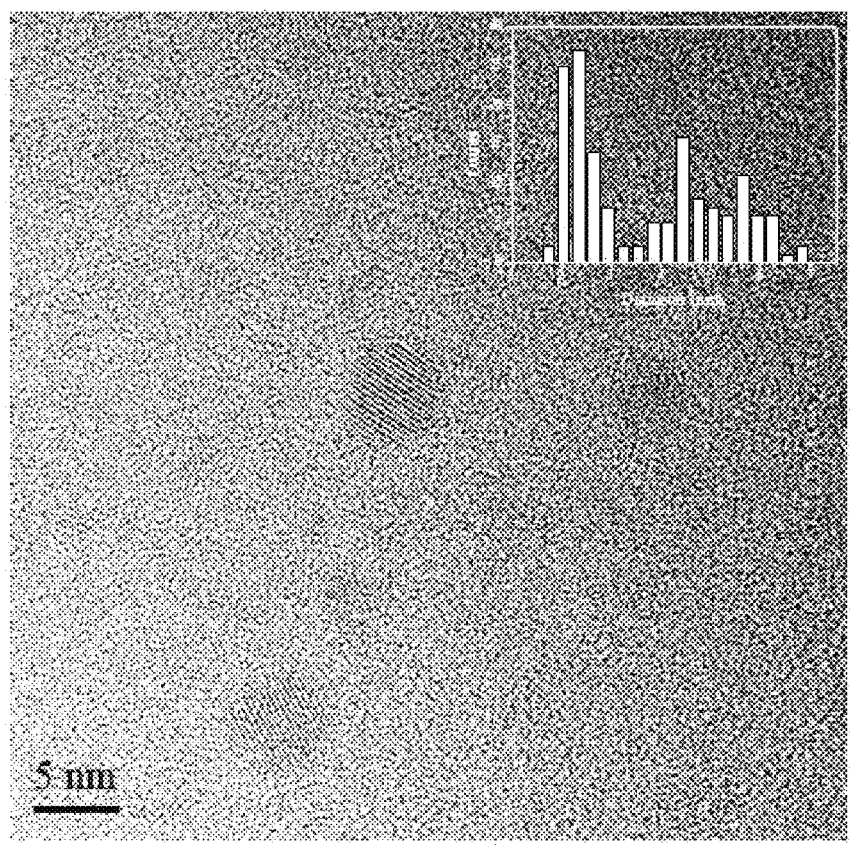
FIG. 4 illustrates the transmission electron microscopy (TEM) image and the size distribution of the quantum dot powders of Comparative Example 1 taken at the 60th second of the crystalline growth reaction.

As shown in FIGS. 3 and 4, it is quite obvious that the smaller seeds (i.e., B-aSeeds) remain at an original size (~2.5 nm) from 15 seconds to 60 seconds, while the bigger seeds (i.e. A-aSeeds) keep growing to larger seeds from 15 seconds to 60 seconds.

Figure 5:
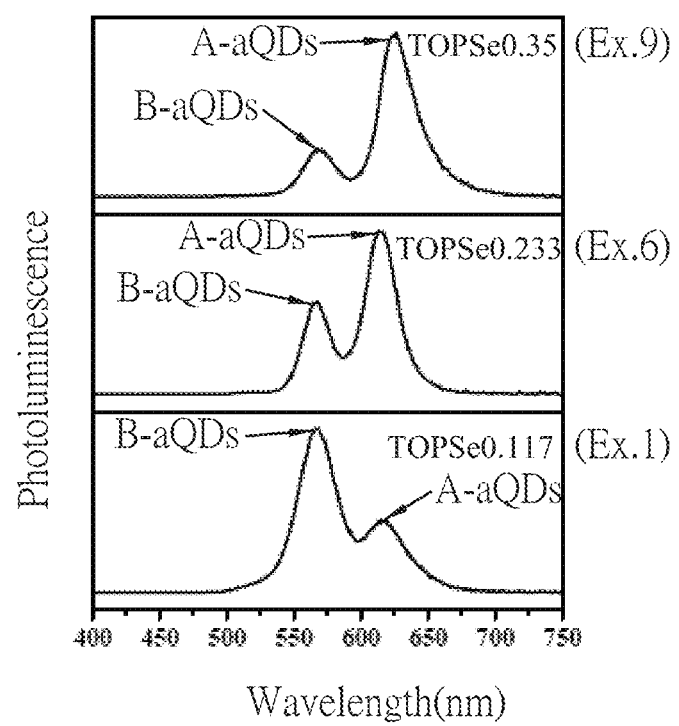
FIG. 5 illustrates photoluminescence spectra of quantum dot powders prepared in Examples 1, 6, and 9 of the disclosure.

FIG. 5 illustrates the photoluminescence spectra of the quantum dot mixtures prepared using different injection amounts of Se (i.e., 0.117 mmol 0.233 mmol, and 0.35 mmol in Examples 1, 6, and 9, respectively). The bimodal quantum dot mixture exhibiting different relative photoluminescence intensities at similar emission wavelengths of around 620 nm (A-aQDs) and 570 nm (B-aQDs) may be generated using different initial injection amounts of Se. As the injection amount of Se increases, the relative intensity of the photoluminescence spectrum of A-aQDs starts to rise, while that B-aQDs decreases. Therefore, this technique to control the relative photoluminescence intensities between two populations of quantum dots having different average particle sizes in the quantum dot mixture may be very useful in optical applications.

Figure 6:
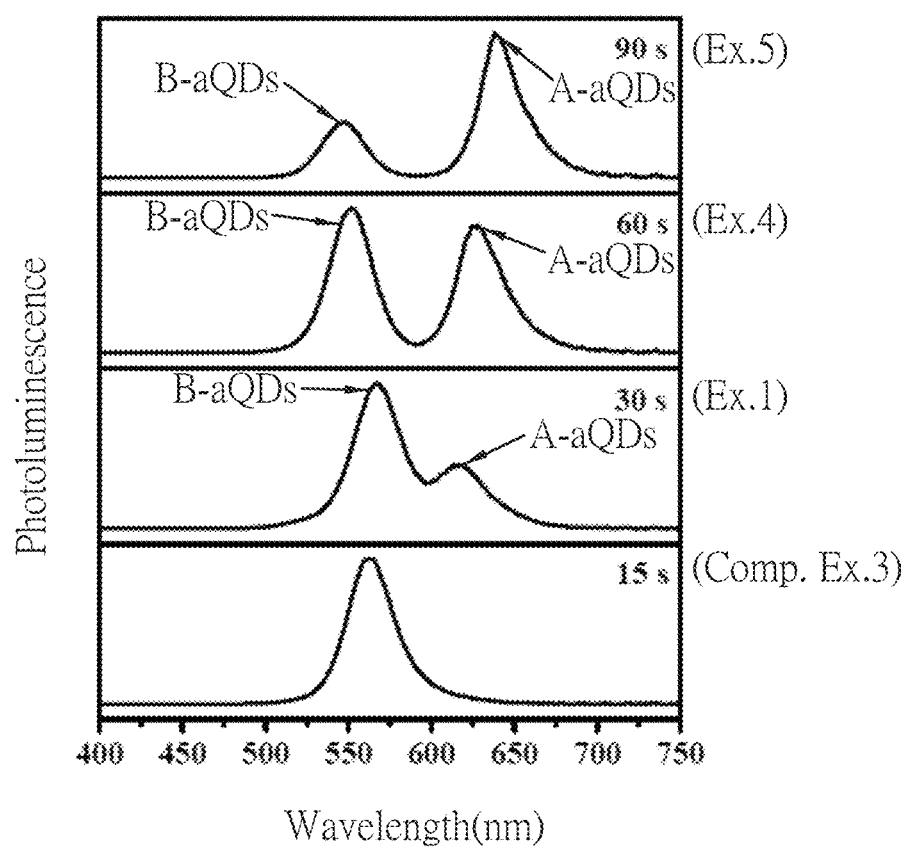
FIG. 6 illustrates photoluminescence spectra of quantum dot powders prepared in Examples 1, 4, and 5 of the disclosure and Comparative Example 3.

As shown in FIG. 6, which illustrates the photoluminescence spectra of the bimodal quantum dot mixtures obtained at different moments of TOPS injection (i.e., 15 seconds, 30 seconds, 60 seconds, and 90 seconds in Comparative Example 3, Example 1, Example 4, and Example 5, respectively), as the interval between TOPSe and TOPS injections increases, the quantum dot mixture with a bimodal size distribution becomes more prominent. When the interval between TOPSe and TOPS injections is 15 seconds (i.e., Comparative Example 3), the quantum dot mixture thus prepared only has a mono-modal size distribution. In addition, the relative photoluminescence intensities of the two populations of the quantum dots (A-aQDs and B-aQDs) having different average particle sizes in the quantum dot mixture will change with the different moments of TOPS injection. As the interval between TOPSe and TOPS injections increases, the relative photoluminescence intensity of the population of the quantum dots having a larger average particle size (i.e., A-aQDs) will be boosted.

Figure 7:
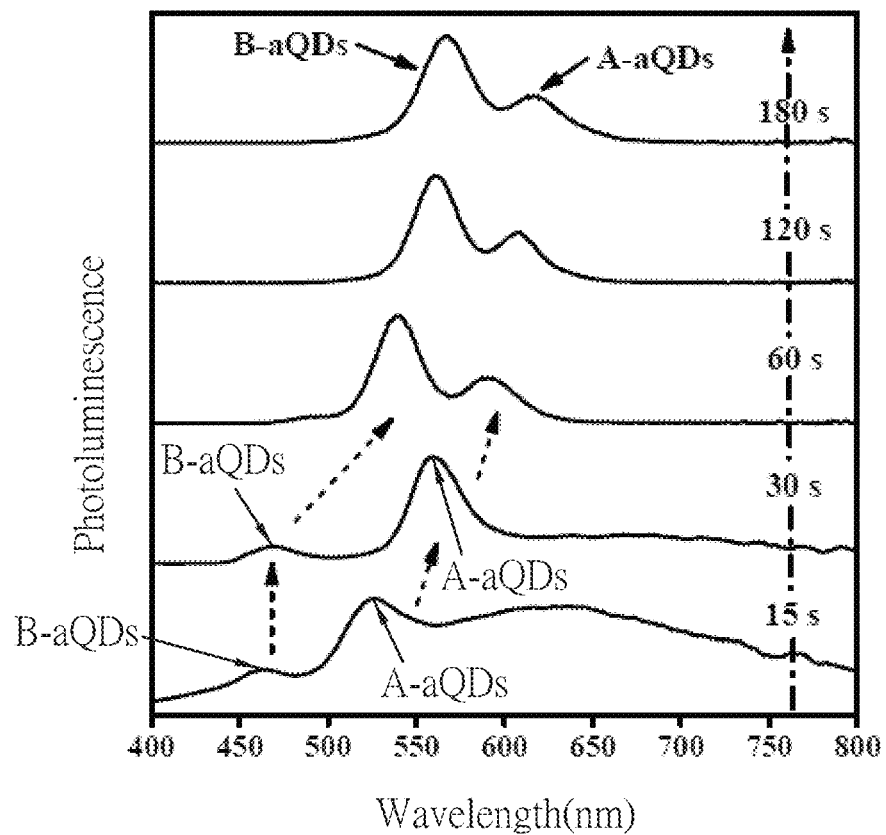
FIG. 7 illustrates the photoluminescence spectra of the quantum dot powders of Example 1 taken at different sampling times of a crystalline growth period.

As shown in FIG. 7, at 15 seconds after the injection of TOPSe, there are two peaks at 530 nm (i.e., A-aSeeds) and 465 nm (i.e., B-aSeeds), respectively. A-aSeeds and B-aSeeds respectively serve as the seeds for crystalline growth of bigger size quantum dots (i.e., A-aQDs) and smaller size quantum dots (i.e., B-aQDs). At 30 seconds after the injection of TOPSe, A-aSeeds kept growing, while B-aSeeds stayed at the original state, and TOPS was injected at this 30-second moment. After the injection of TOPS, both of A-aSeeds and B-aSeeds grew into larger quantum dots. A quantum dot mixture including two populations of the quantum dots (i.e., A-aQDs and B-aQDs) having different average particle sizes were thus obtained, in which A-aQDs have an emission wavelength at around 620 nm and B-aQDs have an emission wavelength at around 570 nm. The quantum yields for A-aQDs and B-aQDs are 30% and 65%, respectively.

Figure 8:
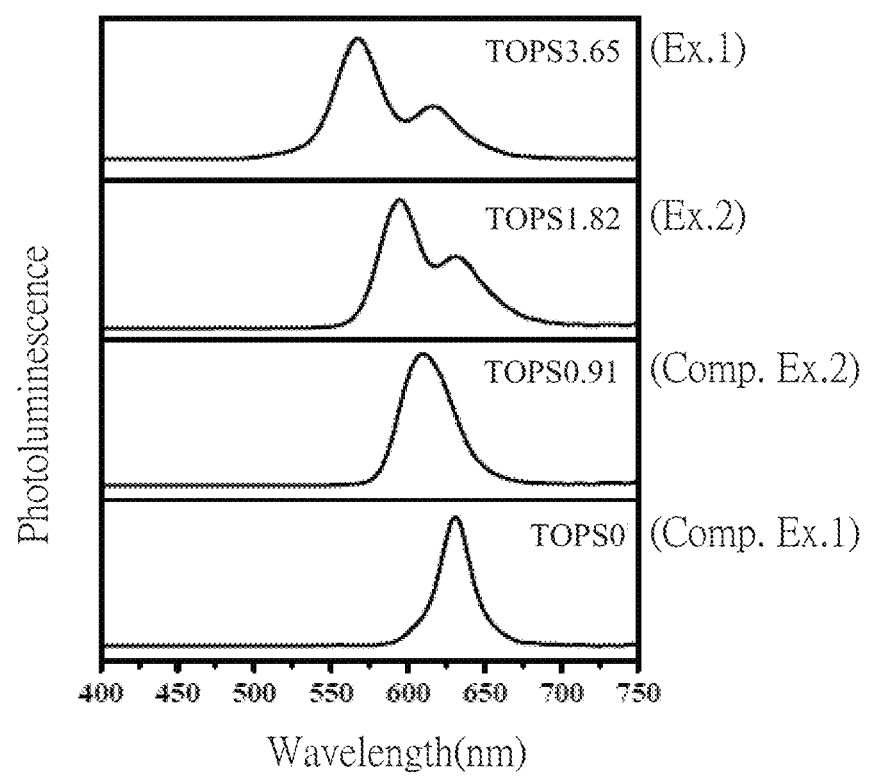
FIG. 8 illustrates the photoluminescence spectra of the quantum dot powders prepared in Examples 1 and 2 of the disclosure and Comparative Examples 1 and 2.

As shown in FIG. 8, which illustrates the photoluminescence spectra of the bimodal quantum dot mixtures prepared by injection of different amounts of S (0 mmol, 0.91 mmol, 1.82 mmol, and 3.65 mmol in Comparative Example 1, Comparative Example 2, Example 2, and Example 1, respectively) at 30 seconds after injection of TOPSe. The results manifest that when the injection amount of S is less than 0.91 mmol, there is only one photoluminescence peak.

Figure 9:
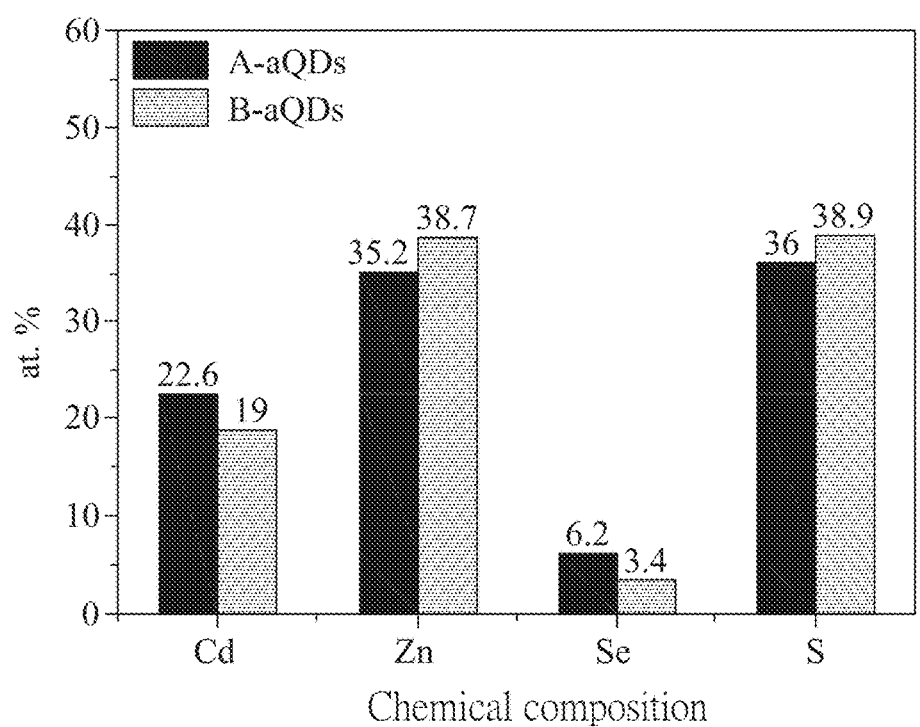
FIG. 9 is a diagram illustrating an ICP-MS elemental analysis of two different populations of quantum dots (i.e., A-aQDs and B-aQDs) in the quantum dot powders prepared in Example 1.

As shown in FIG. 9, both A-aQDs and B-aQDs contain Cd, Zn, Se and S, but with different elemental proportions. A-aQDs contain more percentage of Cd and Se than B-aQDs.

Figure 10:
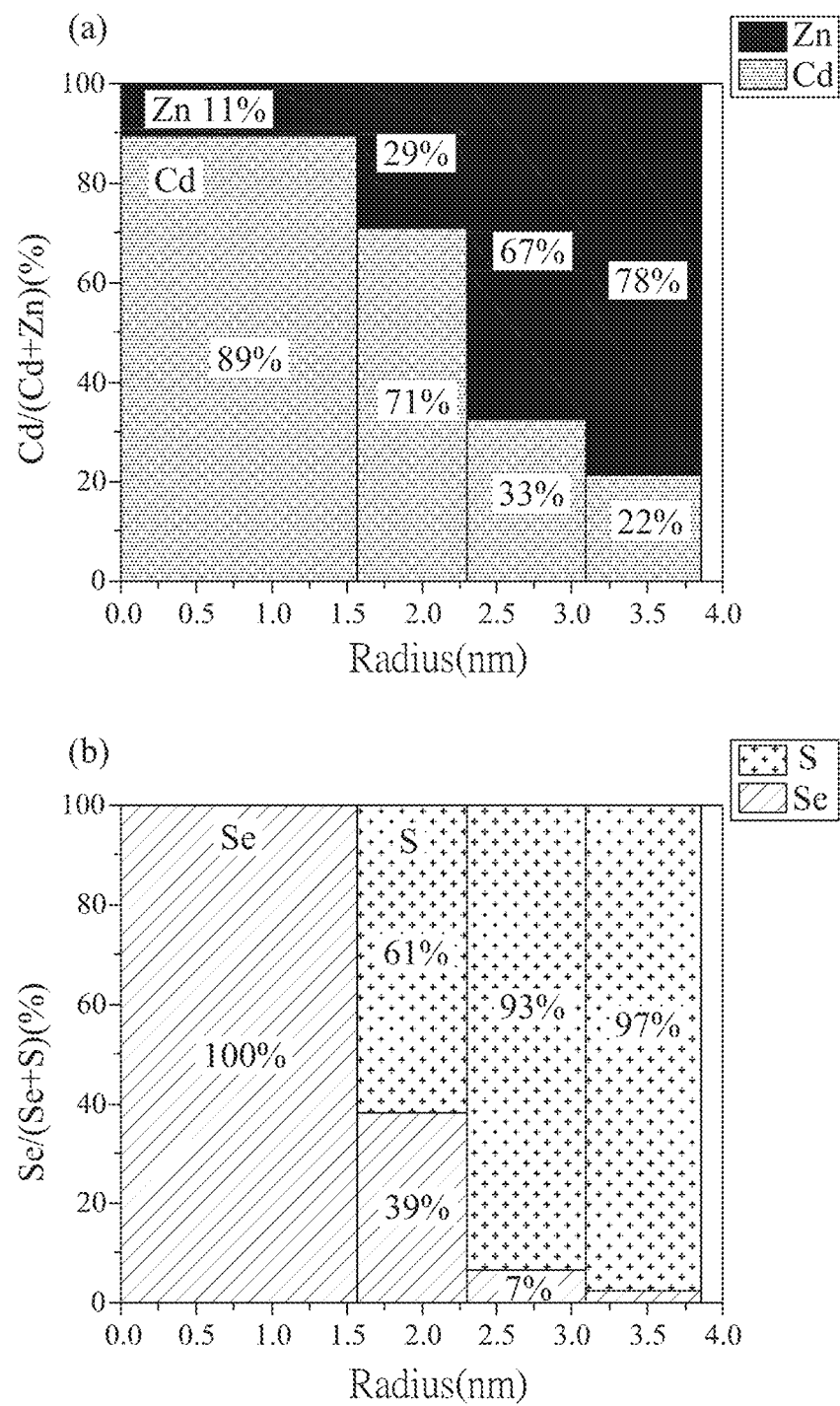
FIG. 10 illustrates quantitative composition profiles of A-aQDs in the quantum dot powders prepared in Example 1.

With reference to FIG. 10, before the injection of TOPS, the Cd- and Se-based cores were generated first, followed by gradual incorporation of the Zn—/Cd— and S-based shells after the injection of TOPS, and finally an outer shell rich in Zn and S was formed. The above result is caused by the reactivity difference between Cd $(OA)_2$ and Zn $(OA)_2$, and the reactivity difference between TOPSe and TOPS. The precursors with higher reactivity like Cd and Se would dominate the composition of the quantum dots first, and then those precursors with lower reactivity like Zn and S would be involved as the reaction proceeds.

Since the dangling bonds on the surface of the quantum dots may be effectively passivated with gradual involvement of Zn and S, the quantum dots with a chemical composition gradient structure may be formed. The chemical composition gradient structure would smooth the abrupt interface between the core and the shell of the quantum dots, and alleviate the strain induced from the lattice mismatch between the layers of the quantum dots.

Figure 11:
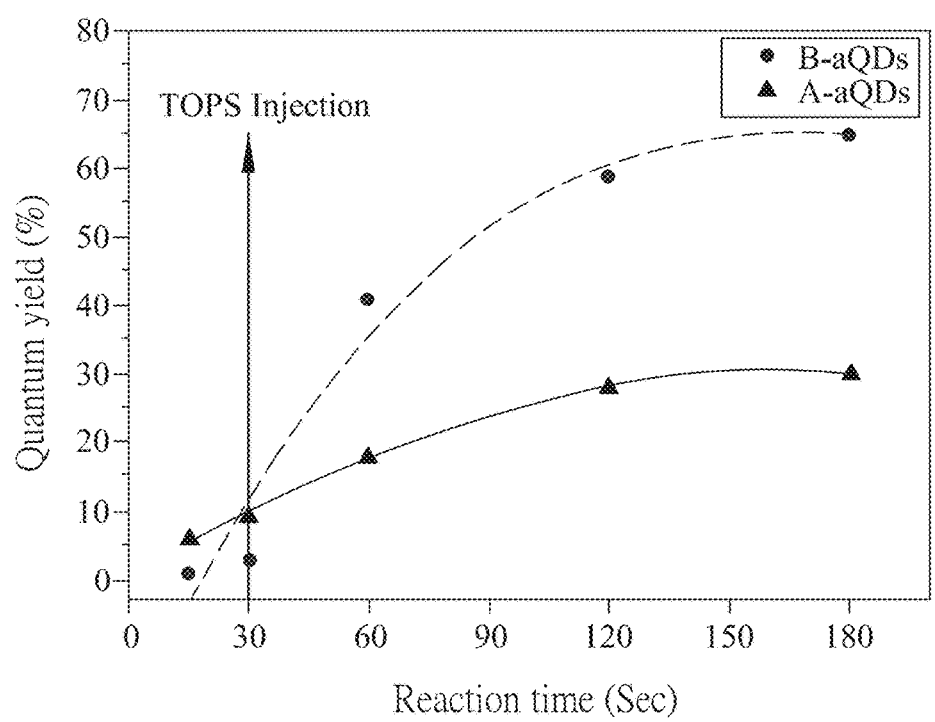
FIG. 11 is a diagram illustrating quantum yields of A-aQDs and B-aQDs in the quantum dot powders of Example 1 taken at different sampling times of the crystalline growth period.

As shown in FIG. 11, after the injection of TOPS, the quantum yield of A-aQDs increased gradually from 9% to 30% and the quantum yield of B-aQDs increased gradually from 3% to 65% as the reaction proceeded.

The quantum dots with the chemical composition gradient structure have a gradient energy gap in the radial direction which can confine electrons and holes within the core and boost the recombination of the electrons and the holes. Thus, the quantum yield may be improved.

As shown in FIG. 12, The light emitting devices made using the quantum dot mixtures prepared in Comparative Example 3, Example 1, and Example 4 were operated at 10 mA with color rendering indices of 56.5%, 64.9%, and 77.1% and chromaticity coordinates of (0.330, 0.48) (0.390, 0.294), and (0.314, 0.295), respectively.

This manifests that the highly luminescent quantum dot mixture with a bimodal size distribution synthesized by the method of the disclosure has a great potential for the application of white light emitting diodes because it is possible to adjust the emission wavelengths of the quantum dot mixture with a bimodal size distribution during the synthesis thereof for different application purposes.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for preparing a quantum dot mixture with a bimodal size distribution, comprising steps of:
   a) preparing a mixed cationic precursor solution containing a precursor of M1 and a precursor of M2, wherein M1 has an atomic number larger than that of M2 and wherein M1 and M2 are independently selected from the group consisting of Zn, Sn, Pb, Cd, In, Ga, Cs, Ge, Ti, Cu, Mn, Co, Fe, Al, Mg, Ca, Sr, Ba, Ni, and Ag;
   b) preparing a first anionic precursor solution containing a precursor of A1 and a second anionic precursor solution containing a precursor of A2, wherein A1 has an atomic number larger than that of A2, and wherein A1 and A2 are independently selected from the group consisting of Se, S, Te, P, As, N, and O;
   c) subjecting the mixed cationic precursor solution and the first anionic precursor solution to a nucleation reaction at a nucleation temperature for a predetermined nucleation time so as to form in a solution of the nucleation reaction a seed mixture which includes:

a first group of seeds trapped in a first chemical potential well which corresponds to an average size of the first group of seeds, and a second group of seeds trapped in a second chemical potential well which corresponds to an average size of the second group of seeds, the average size of the second group of seeds being larger than the average size of the first group of seeds; and d) immediately after step c), injecting the second anionic precursor solution into the solution of the nucleation reaction so as to permit the first group of seeds and the second group of seeds to proceed with a crystallite growth reaction at a crystallite growth temperature for a predetermined crystallite growth time so as to form in a solution of the crystallite growth reaction a quantum dot mixture which includes a population of first quantum dots and a population of second quantum dots respectively grown from the first group of seeds and the second group of seeds, the population of second quantum dots having an average particle size larger than that of the population of the first quantum dots.

2. The method according to claim 1, wherein in step c), the nucleation temperature is in a range from 300° C. to 310° C.

3. The method according to claim 1, wherein in step c), the predetermined nucleation time is longer than 15 seconds.

4. The method according to claim 1, wherein in step d), the crystallite growth temperature is in a range from 300° C. to 310° C.

5. The method according to claim 1, wherein in step d), the predetermined crystallite growth time is in a range from 60 seconds to 300 seconds.

6. The method according to claim 3, wherein the predetermined nucleation time is in a range from 30 seconds to 180 seconds.

7. The method according to claim 5, wherein the predetermined crystallite growth time is in a range from 120 seconds to 180 seconds.

8. The method according to claim 1, wherein the precursor of A2 in the second. anionic precursor solution is in a concentration larger than 0.06 M.

9. The method according to claim 1, wherein M1 is Cd, M2 is Zn, A1 is Se, and A2 is S.

10. The method according to claim 1, further comprising a step of purifying the first quantum dots and the second quantum dots from the solution of the crystallite growth reaction.

11. The method according to claim 1, wherein the first anionic precursor solution further contains a precursor of iodine.

12. A quantum dot mixture with a bimodal size distribution prepared by the method according to claim 1, wherein each of said first and second quantum dots is formed as a core-and-shell configuration which includes:

a core rich in M1 and A1 and having a composition $M1_xM2_{1-x}A1$, wherein $0<x<1$; and a shell including:

an inner shell portion enclosing the core and having a composition of $M1_{x'}$, $M2_{1-x'}$, $A1_yA2_{1-y}$, wherein $0<x'<1$, $0<y<1$, and y is gradually decreased along a radial direction away from the core, and an outer shell portion enclosing the inner shell portion and having a composition of M2A2.

13. The quantum dot mixture according to claim 12, wherein said population of said first quantum dots has an emission wavelength smaller than that of said population of said second quantum dots.

14. The quantum dot mixture according to claim 12, wherein said population of said first quantum dots and said population of said second quantum dots respectively have a quantum yield of at least 15%.

15. The quantum dot mixture according to claim 14, wherein said population of said first quantum dots and said population of said second quantum dots respectively have a quantum yield of at least 20%.

16. The quantum dot mixture according to claim 12, wherein M1 is Cd, M2 is Zn, A1 is Se, and A2 is S.

17. The quantum dot mixture according to claim 12, wherein each of said first and second quantum dots is doped with iodine.

* * * * *